United States Patent
Lin

(10) Patent No.: US 6,570,235 B2
(45) Date of Patent: May 27, 2003

(54) CELLS ARRAY OF MASK READ ONLY MEMORY

(75) Inventor: Chun-Jung Lin, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 150 days.

(21) Appl. No.: 09/811,393

(22) Filed: Mar. 20, 2001

(65) Prior Publication Data

US 2002/0136048 A1 Sep. 26, 2002

(51) Int. Cl.[7] .............................................. H01L 29/76
(52) U.S. Cl. ..................... 257/390; 257/288; 257/344; 257/346; 257/368; 257/506; 257/524; 365/103
(58) Field of Search ................................ 257/390, 288, 257/344, 346, 368, 506, 524; 365/103

(56) References Cited

U.S. PATENT DOCUMENTS

| | | | | |
|---|---|---|---|---|
| 5,164,814 A | * | 11/1992 | Okumura | 257/390 |
| 5,182,619 A | * | 1/1993 | Pfiester | 257/382 |
| 5,804,846 A | * | 9/1998 | Fuller | 257/252 |
| 5,895,955 A | * | 4/1999 | Gardner et al. | 257/336 |
| 6,084,275 A | * | 7/2000 | Wu | 257/390 |
| 6,091,119 A | * | 7/2000 | Wu | 257/390 |
| 6,313,505 B2 | * | 11/2001 | Yu | 257/336 |
| 6,376,885 B1 | * | 4/2002 | Tseng | 257/382 |

FOREIGN PATENT DOCUMENTS

JP          07153941 A    *    6/1995

* cited by examiner

Primary Examiner—Nathan J. Flynn
Assistant Examiner—Remmon R. Fordé

(57) ABSTRACT

A cells array of mask read only memory, at least includes numerous essentially parallel cells chains and numerous isolation dielectric layers which are located between any two adjacent cells chains. Each cells chain at least includes: numerous gates that located on a substrate, numerous doped regions, numerous polysilicon layers, numerous cover dielectric layers, a conductor layer and numerous isolation dielectric layers. Whereby, each gate at least include a gate dielectric layer, a gate conductor layer and a spacer, and height of spacer is larger than summation of thickness of gate dielectric layer and thickness of gate conductor layer; doped regions are located in the substrate, and each doped region is located between two neighboring gates; each doped region is covered by one polysilicon layer, and height of each polysilicon layer is larger than summation of thickness of gate dielectric layer and thickness of each gate conductor layer; each polysilicon layer is covered by one cover dielectric layer; and conductor layer covers both the gates and the cover dielectric layers. Moreover, height of each isolation dielectric layer is larger than summation of thickness of gate dielectric layer and thickness of each gate conductor layer.

20 Claims, 10 Drawing Sheets

CELLS ARRAY OF MASK READ ONLY MEMORY

BACKGROUND OF THE INVENTION

1. Field of the Invention

The present invention generally relates to a cell of mask read only memory (ROM), and particularly relates to a cells array of mask ROM with both low word line resistance and larger process window.

2. Description of the Prior Art

Essential configuration of cells array of conventional mask ROM is shown in FIG. 1 which is a top-view illustration. Numerous word lines 11 crisscross numerous bit lines 12, each word line 11 is essentially parallel to and insulated to other word lines 11, and each bit line 12 is essentially parallel to and insulated to other bit lines 12. Moreover, one cell 13 of mask ROM is formed by gate, where one word line 11 crosses one bit line 12, and surrounding space. In general, as shown in FIG. 2A which is cross-sectional illustration along AA1, structure of conventional cell 13 comprises doped regions 22, and gate 23. Doped regions 22 are located in substrate 21 and are used to form sources and drains, gate 23 at least includes gate dielectric and gate conductor (not shown in FIG. 2A).

Significantly, whether any cell 13 is opened or closed is decided by how threshold voltage of this cell 13 is adjusted in a code process. Further, in the code process, photoresist is used to cover part of cells which need not to adjust threshold voltage but to expose other part of cells which need to adjust threshold voltage in accordance with data to be stored, and then an ion implantation process is performed to implant numerous ions into part of substrate which under gates should be adjusted corresponding threshold voltage. However, owing to limitation of structure of cells 13 (or cells array), some defects of code process will is more serious while scale of mask ROM is continually decreased: because photoresist 24 is used by this code process to control which cells are exposed and then ions 25 can be implanted into these uncovered cells, as FIG. 2B shows, defects will be happened while location of photoresist 24 is misalined, as FIG. 2C shows, that will let part of ions 25 are implanted into cells that should be not be implanted. Reasonably, because that distance between neighboring gates is decreased as size of cells is decreased, acceptable misalignment of photoresist also is proportionally decreased. In other words, process window is decreased and then both cost of corresponding fabrication is increased and quality of corresponding products is decreased.

Furthermore, because that lateral scatter of ions in the ions implantation process always is negligible, no matter it is owing to laterally incident ions 25, owing to scatters of ions induced by gate 23, or is owing to other unavoidable limitations of practical fabrication. It is indisputable that interference between neighboring cells always is negligible, except while scale of mask ROM cells is continually decreased.

Besides, because sources and drains of conventional mask ROM cells is provided by doped regions 22 which located in substrate 21, it also is significantly that thickness of doped regions 22 is decreased as scale of cells is decreased, and then an unavoidable defect is that resistance of doped regions 22 is increased.

Accordingly, conventional structure of cells of mask ROM can not avoid some defects that are more and more serious while scale of cells is continually decreased. Thus, it is desired to develop a new mask ROM cell and a new mask ROM cells array to let mask ROM can be properly applied in the deep-submicron devices.

SUMMARY OF THE INVENTION

The primary object of the invention is to present cell of mask ROM, and especially is to present suitable cell of mask ROM for deep submicron product.

Another object of the invention is to provide a cells array of mask ROM with low word line resistance and larger process window.

One preferred embodiment is a cells array of mask read only memory, at least includes numerous essentially parallel cells chains and numerous isolation dielectric layers which are located between any two adjacent cells chains. Each cells chain at least includes: numerous gates, numerous doped regions, numerous polysilicon layers, numerous cover dielectric layers, a conductor layer and numerous isolation dielectric layers. Moreover, each gate at least include a gate dielectric layer, a gate conductor layer and a spacer, and height of spacer is larger than summation of thickness of gate dielectric layer and thickness of gate conductor layer; doped regions are located in the substrate, and each doped region is located between two neighboring gates; each doped region is covered by one polysilicon layer, and height of each polysilicon layer is larger than summation of thickness of gate dielectric layer and thickness of each gate conductor layer; each polysilicon layer is covered by one cover dielectric layer; and conductor layer covers both the gates and the cover dielectric layers. Moreover, height of each isolation dielectric layer is larger than summation of thickness of gate dielectric layer and thickness of any gate conductor layer.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Aims at defects of conventional cells/cells array of mask ROM, especially defects which are more and more serious while scale is continually decreased, Applicant of this invention provides following clues. First, interference between neighboring cells during the ions implantation process is induced by the fact that ions are improperly implanted into part of substrate which should not be implanted to change corresponding threshold voltage, and it can be effectively improved by properly modify gate structure, and neighboring structure(s), to enhance the ability of preventing ions propagating. Second, because gate always induces lateral scatter of implanted ions, modification of gate structure, such as decrease the distance that ions must propagate through, can decrease the probability that ions are scattered. Third, because resistance is inversely proportional to physical scale, even scale of doped regions, such as shallow junctions, is decreased while scale of cells of mask ROM is decreased, it is possible to increase practical scale of sources/drains and reduce resistance by forming conductor on doped regions to let each source/drain is formed by a doped region and overlying conductor. Moreover, because scale of cells still is limited and is decreased, physical scale of conductor is better increased by increasing height but not by increasing cross-area.

Figure 1:
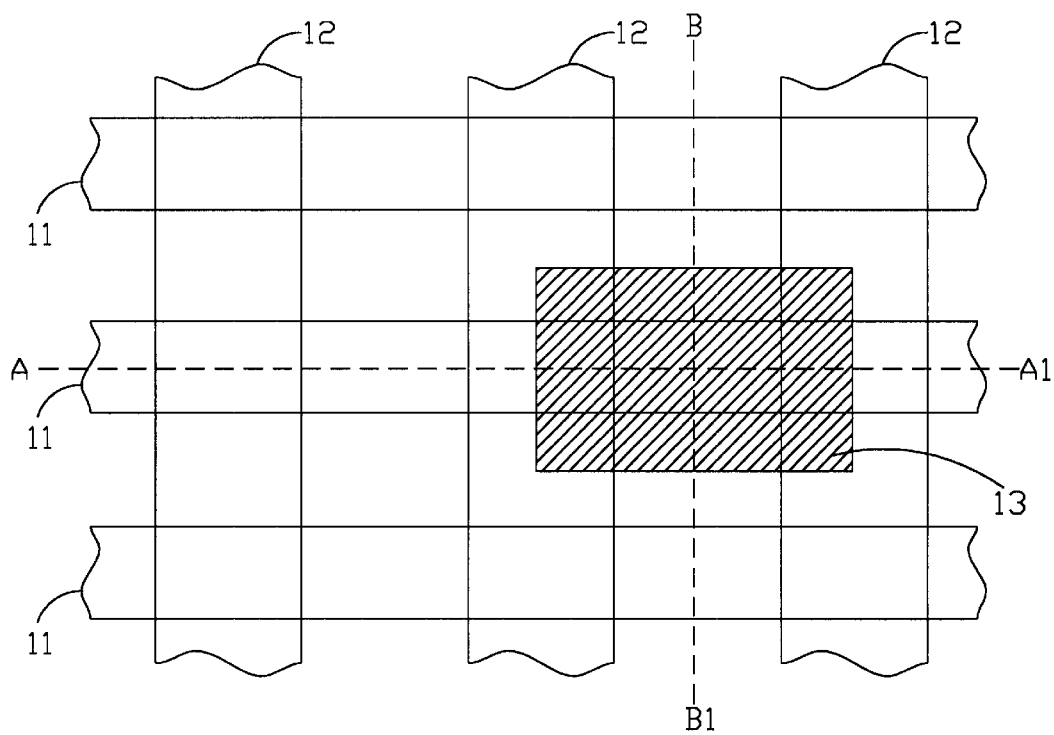
FIG. 1 is a top-view illustration of cells array of mask ROM.
Figure 2A:
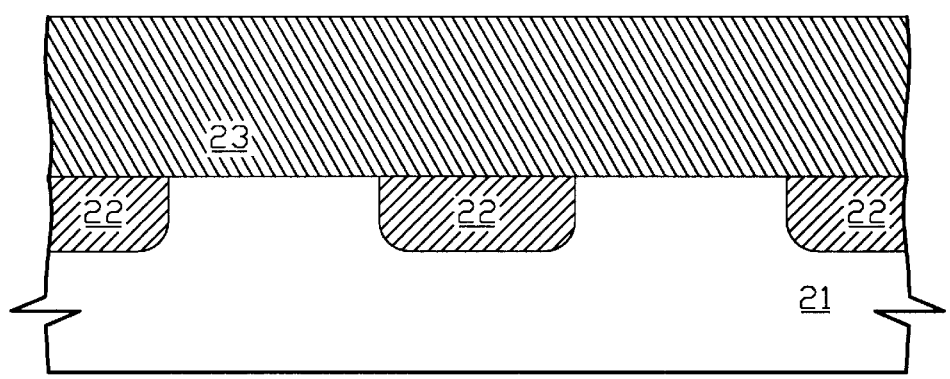
FIG. 2A through FIG. 2C are a series of cross-sectional illustrations about essential structure of conventional mask ROM and often-seen effect of ions implantation.
Figure 2B:
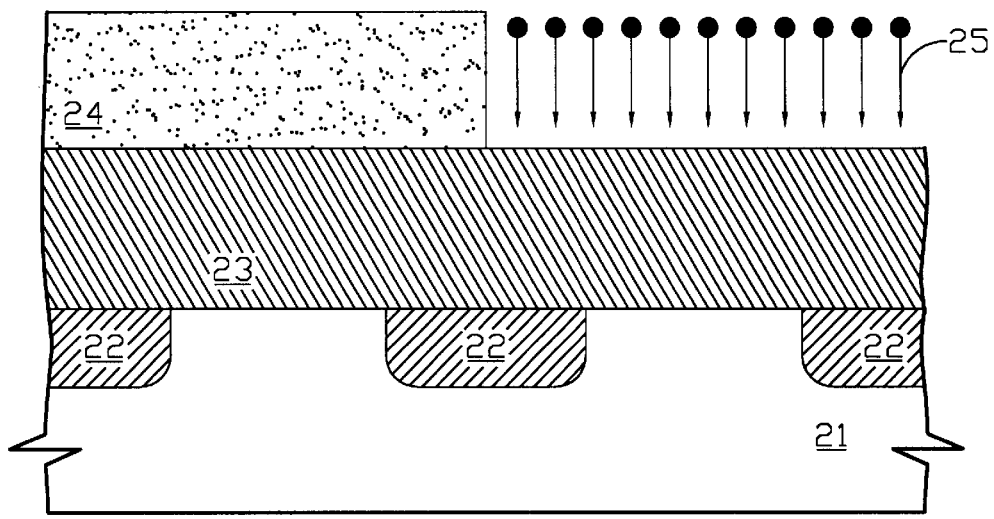
Figure 2C:
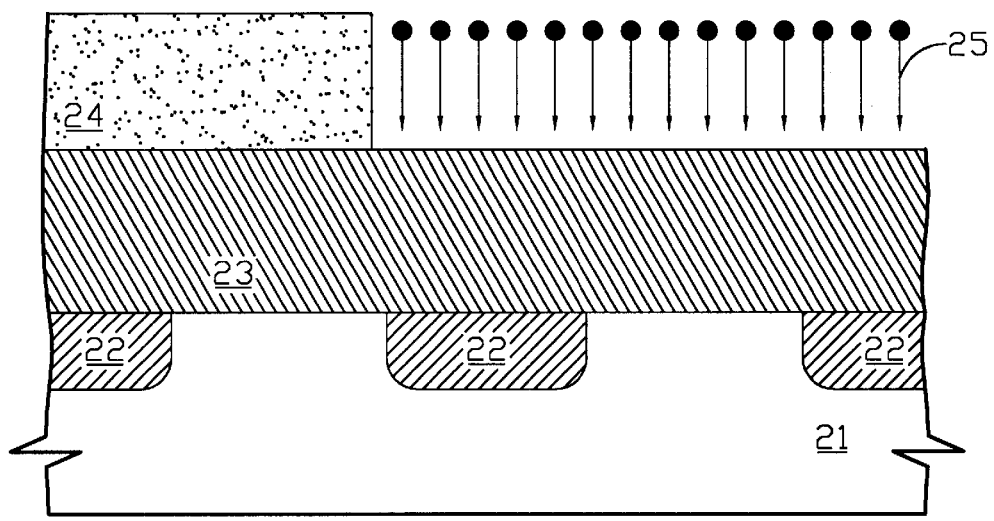

According to previous clues, the Applicant present a solution for improving, even eliminating, these scale-depends defects: configuration to form cells array is similar to well-know mask ROM, which means that top-view illustration still is as FIG. 1 shows; but for each cell, not only polysilicon structures, such as polysilicon plug, locate on doped region but also outline of gate is U-shape. Thus, because each of source/drain is formed by both doped region and overlying polysilicon structure, resistance between source/drain and word line can be maintained in a low value even doped region is a shallow junction; polysilicon structure on doped region can prevent propagation of implanted ions, and then lateral propagated of ions, induced by lateral scatter, between neighboring gates is effectively prevented; and U-shape gate can decrease the thickness that implanted ions must propagated through, such that ions are more easily to be implanted into part of substrate where threshold voltage should be modified.

Figure 3A:
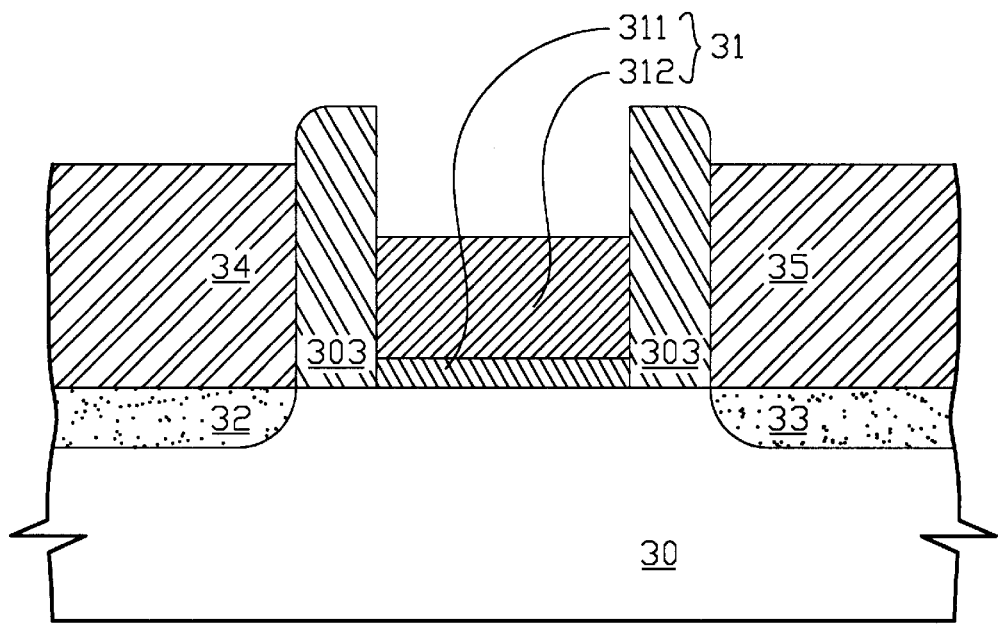
FIG. 3A through FIG. 3D are a series of cross-sectional illustrations about one preferred embodiment of the invention.
Figure 3B:
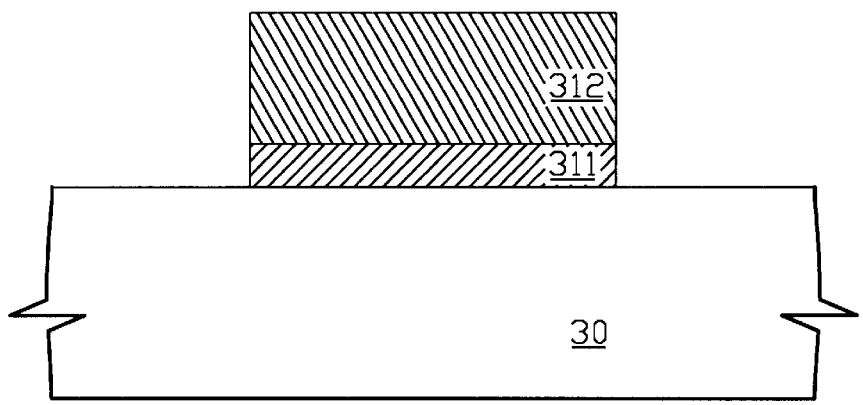

One preferred embodiment of this present invention is a cell of mask read only memory, as FIG. 3A, cross sectional illustration along AA1, and FIG. 3B, cross sectional illustration along BB1, show, the embodiment at least comprises: gate 31, first doped region 32, second doped region 33, first polysilicon layer 34, and second polysilicon layer 35.

Gate 31 is located on substrate 30 and is divided into at least gate dielectric layer 311, gate conductor layer 312, such as polysilicon layer, and spacer 303, located on sidewall. Whereby height of spacer 303 is larger than the summation of thickness of gate dielectric layer 312 and thickness of gate conductor layer 311, and shape of spacer 303 can be varied in accordance with practical requirement, such as spacer 313 is not formed the sidewall in the BB1 direction. Reasonable, because that shape of gate 31 is U-shape, it is natural that ions trends to be implanted through both gate conductor 312 and gate dielectric layer 311 into substrate but do not trend to be lateral scatter through spacer 303 even also through gate conductor 312 and/or gate dielectric layer 311, into neighboring gate 31.

First doped region 32 and second doped region 33 are located in substrate 30, and first doped region 32 and second doped region 33 are located on opposite sides of gate 31, further, electricity of second doped region 33 is equal to electricity of first doped region 32. Beside, partial first doped region 32 can be located under gate 31, and partial second doped region 33 also can be located under gate 31.

First polysilicon layer 34 is located on first doped region 32, and second polysilicon layer 35 is located on second doped region 33. Moreover, height of first (second) polysilicon layer 34 (35) is larger than summation of thickness of gate dielectric layer 311 and thickness of gate conductor layer 312. Surely, each polysilicon layer 34/35 should be properly insulated from gate conductor 312, and the relation between height of spacer 303 and each polysilicon layer 34/35 is not limited. Significantly, except each polysilicon layer 34/35 can form a raised source (raised drain) with underlying doped region 31/32 to let resistance of source/drain is decreased, polysilicon layers 34 and 35, which located on surrounding of gate 31 and are higher then gate conductor layer 312, can reduce the quantity that ions are implanted into gate 31 and underlying substrate 30 from surrounding of gate 31, and then probability of improperly interference of gate 31 is decreased.

Figure 3C:
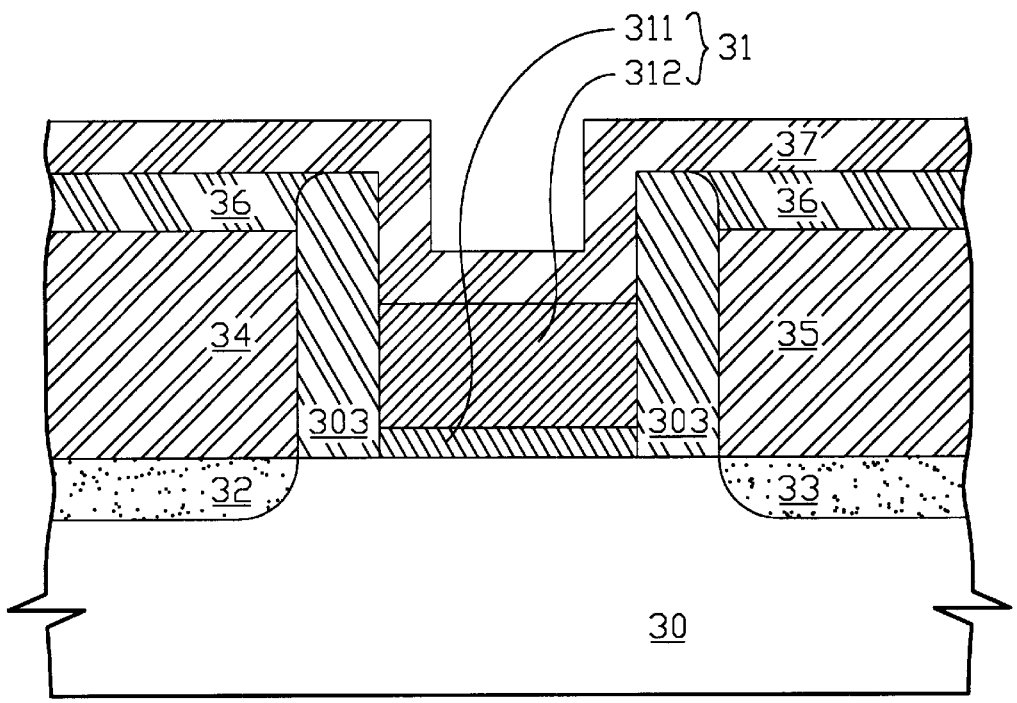
Figure 3D:
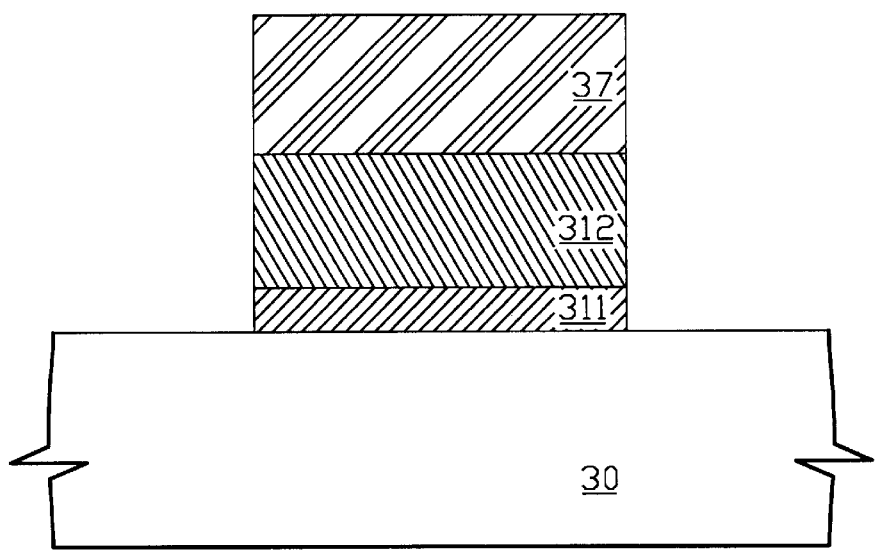

Besides, the embodiment can further comprises cover dielectric layer 36, such as silicon oxide layer, on both first polysilicon layer 34 and second polysilicon layer 35; the embodiment also can further comprises conductor layer 37 on gate conductor layer 312, wherein conductor layer 37 maybe is a conformal layer or fully fills the shallow formed by gate conductor layer 312 and spacer 303. Moreover, conductor layer 37 is used to form word line, conductor layer 37 also can be located on both polysilicon layers 34/35 with a limitation that conductor layer 37 is properly insulated from both polysilicon layers 34/35. In addition, material of conductor layer 37 is chosen from a group consisting of metal, metal suicide, polysilicon, combination of metal and metal suicide, combination of metal and polysilicon, and combination of polysilicon and metal silicide. Further, first polysilicon layer 34 and second polysilicon layer 35 can be replaced by a conductor layer, such as metal silicide layer, and both polysilicon layers 34 and 35 also can be replaced by a dielectric layer while cell allows larger resistance, especially larger resistance between cell and bit line. Whereby, FIG. 3C, along AA1, and FIG. 3D, along BB1, show the case that both cover dielectric layer 36 and conductor layer 37 are existent.

Figure 4A:
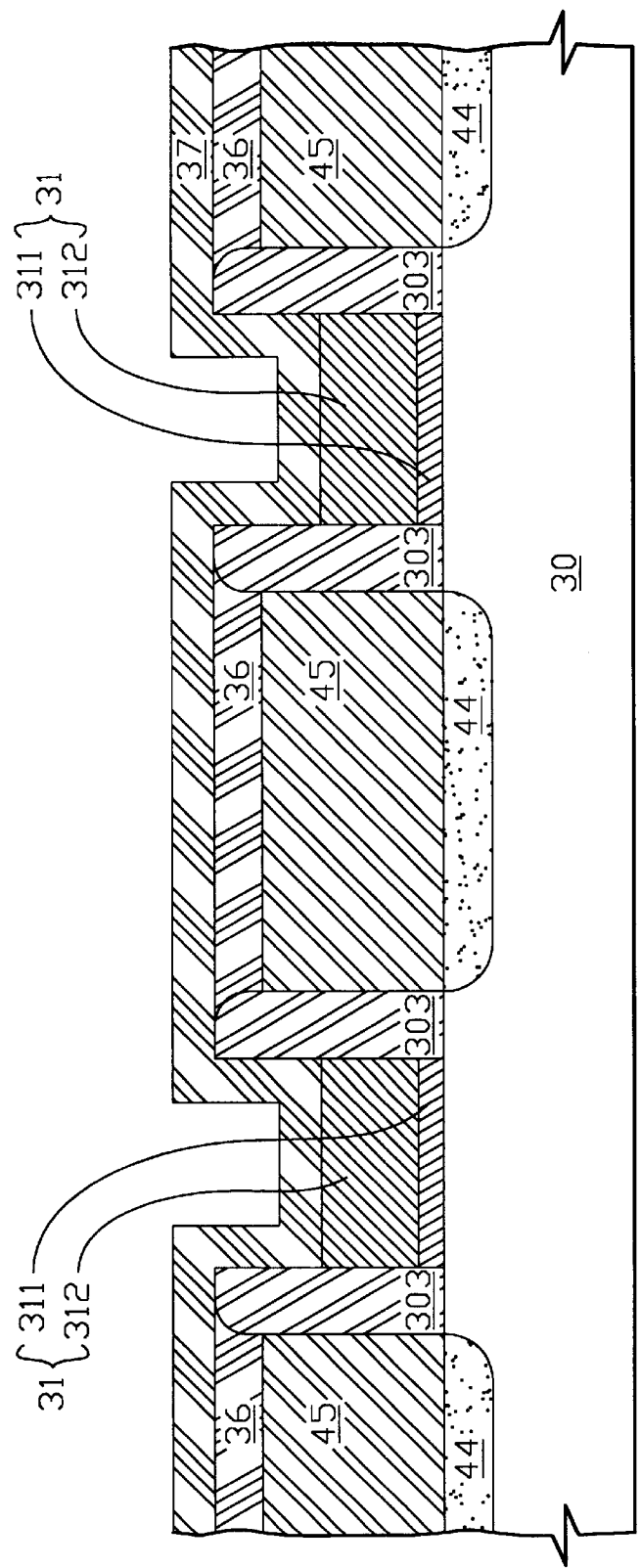
FIG. 4A through FIG. 4F are a series of cross-sectional illustrations about another preferred embodiment of the invention.
Figure 4B:
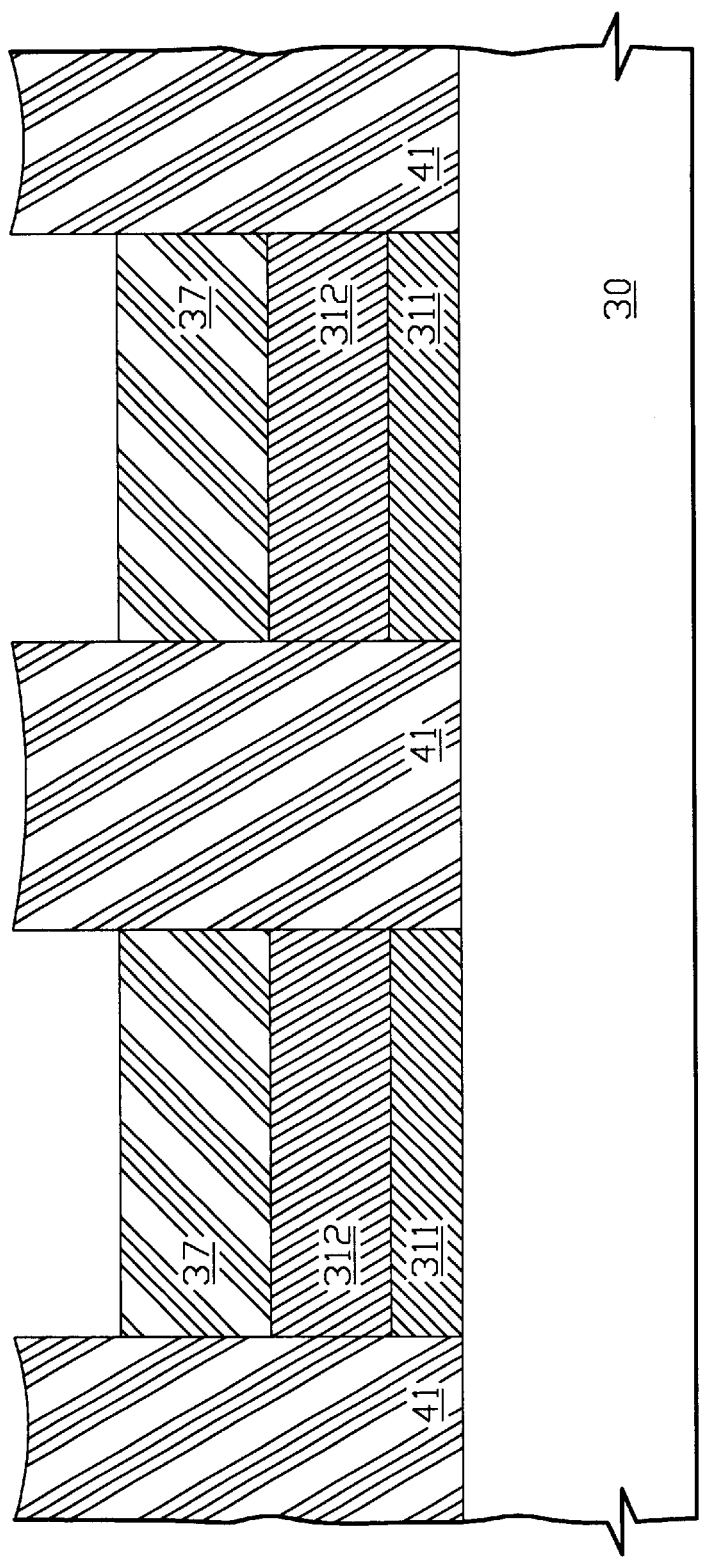

Another embodiment of this invention is a cells array of mask read only memory. As FIG. 4A and FIG. 4B shows, where same labels as both FIG. 3A and FIG. 3B indicate same contents and 44 indicate doped region and 45 indicates polysilicon layer, the embodiment at least includes: numerous parallel cells chains and numerous isolation dielectric layers 41. Whereby, each cells chain comprises numerous cells o and essential structure of each cell is similar to previous embodiment. Further, isolation dielectric layers 41 locate on substrate 30, each isolation dielectric layer 41 is located between two adjacent cells chains, and height of each isolation dielectric layer 41 is larger than summation of thickness of gate dielectric layer 311 of most neighboring cells chain and thickness of each gate conductor layer 312 of most neighboring cells chain. Besides, any two adjacent cells chain is insulated by one insulation dielectric layer 41.

Figure 4C:
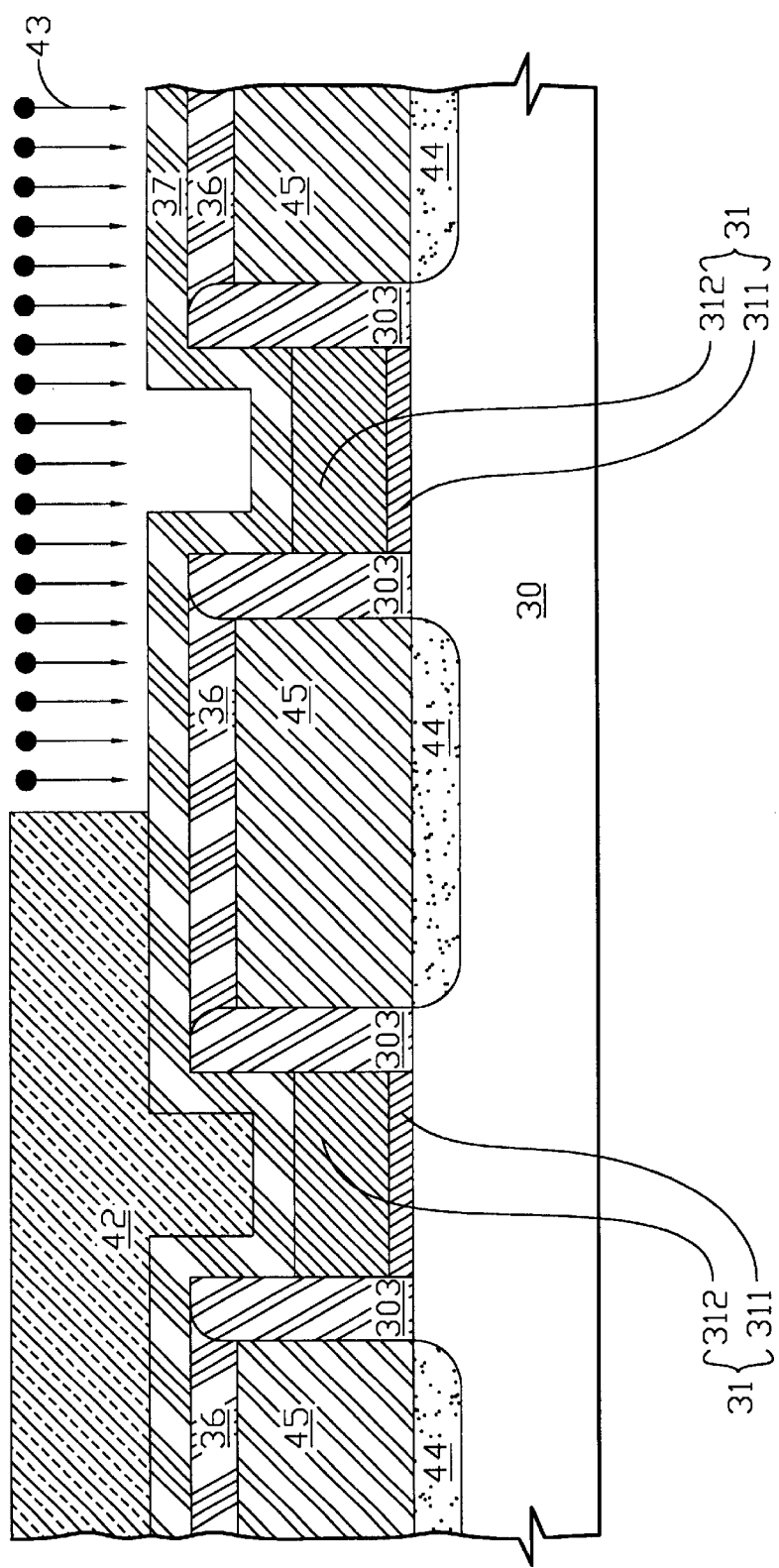
Figure 4D:
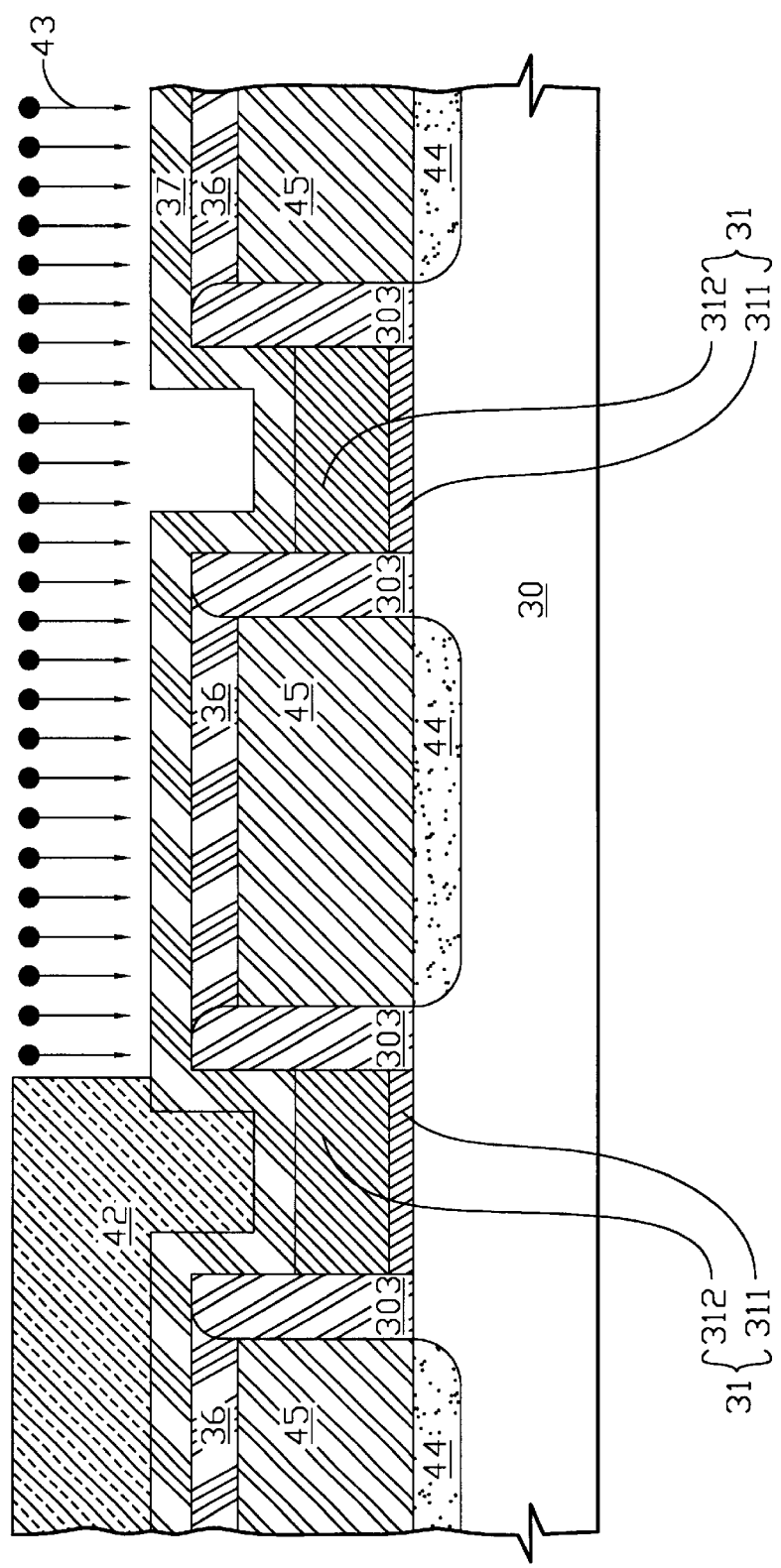
Figure 4E:
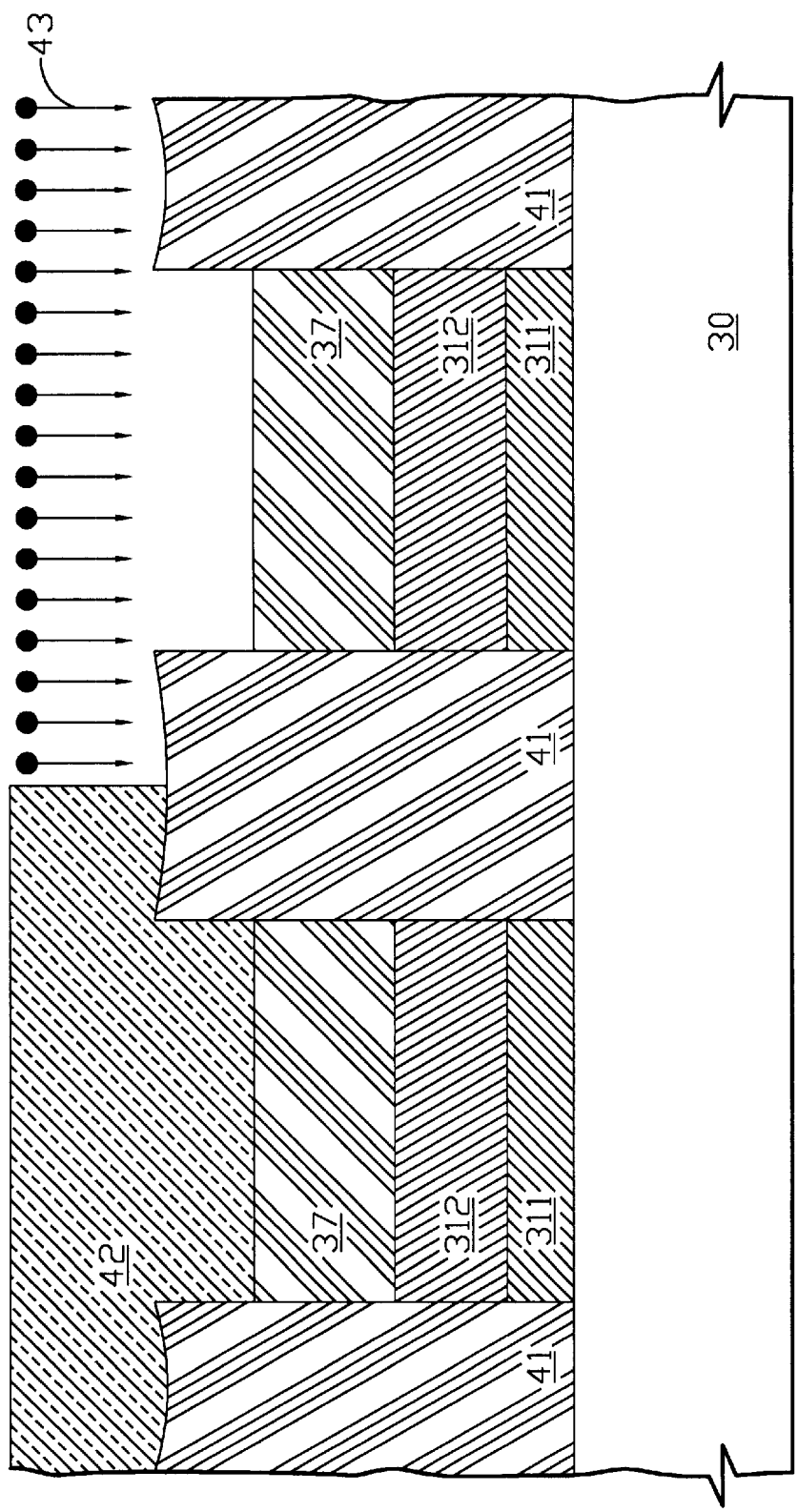
Figure 4F:
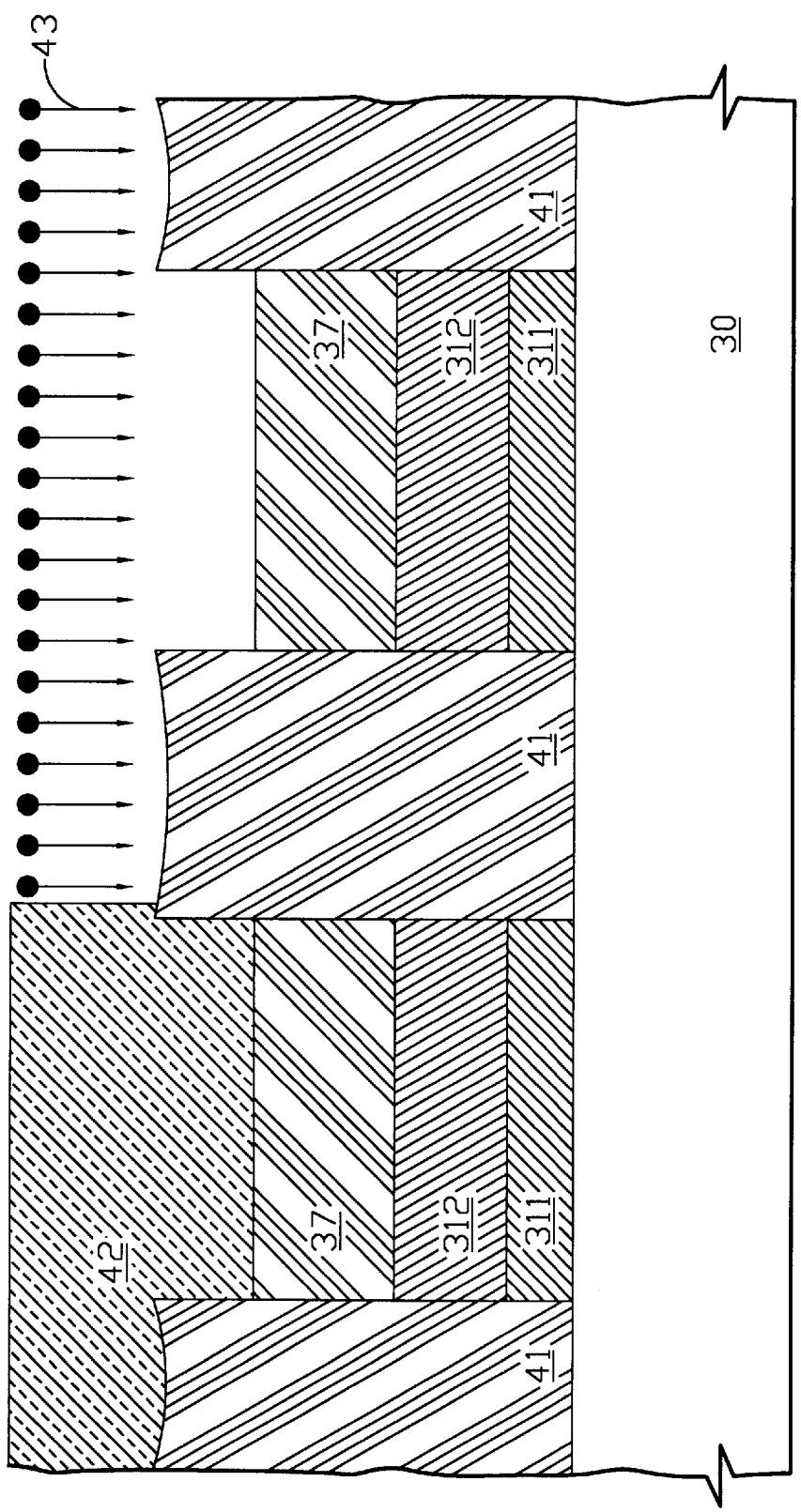

Furthermore, during operation of ions implantation process for adjusting threshold voltage of partial cells, code photoresist 42 is formed on substrate 30 and covers some cells, and then numerous ions 43, such as boron ions or phosphorus ions, are implanted into part of substrate 30 which is not covered by code photoresist 42, as shown in FIG. 4C and FIG. 4D. Significantly, while code photoresist 42 is mis-aligned as shown in FIG. 4E and FIG. 4F, because that in the AA1 direction gate 31 is surrounded by polysilicon layers 45 and shape of gate is U-shape, and because that in BB1 direction gate 31 also is surrounded by isolation dielectric layer 41, which is higher than gate 31, it is natural that partial lateral scatted ions 43 and partial mis-aligned ions 43 must propagate through more thicker material than partial properly implanted ions 43, and then a directly result is that both partial lateral scatted ions 43 and partial mis-aligned ions 43 are more difficulty to be implanted into substrate 30. In other words, by referring to FIG. 4C and FIG. 4D, the embodiment provide self-alignment function during ions implantation process for adjusting threshold voltage for some cells.

Accordingly, because this present cells array can allow larger mis-alignment of code photoresist 42, process window of fabrication of mask ROM is directly increased. Meanwhile, because interference is decreased, especially because application of U-shape gate can enhance the probability that ions 43 propagates through gate into substrate 30, this present cells array also can provide self-aligned ions implantation, which means that implanted location of ions 43 not only is decided by location of code photoresist 42 but also is decided by shape and material of structures on substrate 30. In other words, as a strong contrast of well-know cells array of mask ROM, this embodiment needs not to adjust ions implantation process of structure of cells of mask ROM for preventing lateral scatter, this embodiment also needs not to precisely control photolithography process for ensuring misalignment of code photoresist always covers any cell which should not be implanted.

Although specific embodiments have been illustrated and described, it will be obvious to those skilled in the art that various modifications may be made without departing from what is intended to be limited solely by the appended claims.

What is claimed is:

1. A cell of mask read only memory, comprising:
    a gate, said gate being located on a substrate and being divided into at least a gate dielectric layer, a gate conductor layer and a spacer, said spacer being higher than other portions of said gate;
    a first doped region, said first doped region being located in said substrate;
    a second doped region, said second doped region being located in said substrate, wherein said first doped region and said second doped region being located on opposite sides of said gate;
    a first polysilicon layer, said first polysilicon layer being located on said first doped region, wherein said first polysilicon layer is higher than said gate; and
    a second polysilicon layer, said second polysilicon layer being located on said second doped region, wherein said second polysilicon layer is higher than said gate.

2. The cell of claim 1, wherein part of said first doped region is located under said gate.

3. The cell of claim 1, wherein part of said second doped region is located under said gate.

4. The cell of claim 1, wherein both said first polysilicon layer and said second polysilicon layer can be replaced by a conductor layer.

5. The cell of claim 1, wherein said first polysilicon layer and said second polysilicon layer can be replaced by a dielectric layer while said cell allows larger resistance.

6. The cell of claim 1, further comprises a cover dielectric layer which covers both said first polysilicon layer and said second polysilicon layer.

7. The cell of claim 6, wherein material of said cover dielectric layer is silicon oxide.

8. The cell of claim 1, wherein material of said gate conductor layer is polysilicon.

9. The cell of claim 1, the height of said spacer being larger than the summation of the thickness of said gate dielectric layer and the thickness of said gate conductor layer.

10. The cell of claim 1, the height of each said polysilicon layer being larger than the summation of the thickness of said gate dielectric layer and the thickness of said gate conductor layer.

11. A cells array of mask read only memory, comprising:
    a plurality of cells chains, each said cells chain being essentially parallel to other said cells chains, each said cells chain comprising:
        a plurality of gates, wherein said gates are located on a substrate and; each said gate at least includes a gate dielectric layer, a gate conductor layer and a spacer, wherein said spacer being higher than other portion of said gate
        a plurality of doped regions, wherein said doped regions are located in said substrate, and each said doped region is located between two neighboring said gates of said cells chain;
        a plurality of polysilicon layers, wherein each said doped region is covered by one said polysilicon layer, each said polysilicon layer being higher than said gate;
        a plurality of cover dielectric layers, wherein each said polysilicon layer is covered by one said cover dielectric layer; and
        a conductor layer, wherein said conductor layer covers both said gates and said cover dielectric layers; and
    a plurality of isolation dielectric layers, said isolation dielectric layers being located in said substrate and each said isolation dielectric layer being located between two neighboring said cells chain, wherein height of each said isolation dielectric layer is larger than the summation of the thickness of said gate dielectric layer and the thickness of each said gate conductor layer.

12. The cells array of claim 11, wherein partial of any said doped region can be located under neighboring said gates.

13. The cell array of claim 11, wherein material of said conductor layer is chosen from a group consisting of metal, metal suicide, polysilicon, combination of metal and metal suicide, combination of metal and polysilicon, and combination of polysilicon and metal silicide.

14. The cell array of claim 11, wherein each of said polysilicon layers can be replaced by a conductor layer.

15. The cell array of claim 11, wherein each of said polysilicon layers could be replaced by a dielectric layer while said cells allay allows larger resistance.

16. The cell array of claim 11, wherein material of said gate conductor layer is polysilicon.

17. The cell array of claim 11, wherein material of said cover dielectric layer is silicon oxide.

18. The cell array of claim 11, wherein any two adjacent said cells chains are insulated by one said isolation dielectric layer.

19. The cell array of claim 11, the height of each said spacer being larger than the thickness of both said gate dielectric layer and said gate conductor layer of corresponding said gate.

20. The cell array of claim 11, height of each said polysilicon layer being larger than the summation of the thickness of said gate dielectric layer and the thickness of each said gate conductor layer.

* * * * *